United States Patent
Taurand

[19]

[11] Patent Number: 6,121,768
[45] Date of Patent: Sep. 19, 2000

[54] D.C.-D.C.-TYPE BIDIRECTIONAL VOLTAGE CONVERTERS AND CURRENT SENSOR

[75] Inventor: Christophe Taurand, Valence, France

[73] Assignee: Sexant Avionique, Velizy-Villacoublay, France

[21] Appl. No.: 08/860,728
[22] PCT Filed: Jan. 10, 1996
[86] PCT No.: PCT/FR96/00040
§ 371 Date: Sep. 23, 1997
§ 102(e) Date: Sep. 23, 1997
[87] PCT Pub. No.: WO96/21864
PCT Pub. Date: Jul. 18, 1996

[30] Foreign Application Priority Data

Jan. 13, 1995 [FR] France .................... 95 00542

[51] Int. Cl.$^7$ .......... G01R 19/00; G01R 15/18; H02M 3/00
[52] U.S. Cl. .......... 324/117 R; 324/120; 324/127; 363/20
[58] Field of Search .......... 324/117 R, 120, 324/127; 363/20, 21

[56] References Cited

U.S. PATENT DOCUMENTS

| | | |
|---|---|---|
| 5,068,776 | 11/1991 | Polivka . |
| 5,636,108 | 6/1997 | Taurand ........................... 363/20 |
| 5,657,211 | 8/1997 | Brockmann .................. 363/20 X |
| 5,745,351 | 4/1998 | Taurand ........................... 363/20 |

FOREIGN PATENT DOCUMENTS 3511710  10/1968  Germany .

*Primary Examiner*—Gerard Strecker
*Attorney, Agent, or Firm*—Arthur L. Plevy

[57] ABSTRACT

A bidirectional current sensor including a transformer having a primary winding arranged in a circuit likely to be run through by a current to be measured, a secondary winding, an impedance for demagnetizing the transformer, and a measuring resistor connected to the secondary winding via a switch controlled to be on when a current is likely to run through the primary winding. It applies in particular to the detection of currents in bidirectional voltage converters.

12 Claims, 11 Drawing Sheets

D.C.-D.C.-TYPE BIDIRECTIONAL VOLTAGE CONVERTERS AND CURRENT SENSOR

BACKGROUND OF THE INVENTION

1. Field of the Invention

The present invention relates to the field of switched mode power supplies, and more specifically to the field of d.c.-d.c.-type inductive storage voltage converters. Such converters, which enable to transform d.c. voltages, have many industrial applications, especially in the aeronautic field, where they are used to generate, from the d.c. electric network of aircrafts, voltages of 5V, ±12V, ±15V, . . . for supplying on-board electronic equipment.

2. Discussion of the Related Art

Generally, the operation of inductive storage converters is based on the implementation of energy transfer cycles including a period of accumulation of magnetic energy in an inductive component, via a primary circuit, followed by a period of restitution of this energy into a load to be supplied, via a secondary circuit. A "buck-boost" converter is a converter, the inductive component of which is a single-winding inductance, and a "fly-back" converter is a converter, the inductive component of which is a transformer including at least two windings.

In this field, the present invention more specifically relates to bidirectional voltage converters, which can transfer energy from the primary to the secondary as well as from the secondary to the primary. This type of bidirectional converter is particularly well suited to the supplying of complex loads (capacitive and/or inductive loads), accumulators or, further, reversible devices such as electric motors, which are likely to send energy back to the converter.

Examples of inductive storage bidirectional converters are described in U.S. Pat. No. 3,986,097, relating to converters of "fly-back" type, as well as in U.S. Pat. No. 4,736,151 and European patent application 336725, relating to converters of "buck-boost" type.

A general object of the present invention is to improve these bidirectional converters, the operation of which will first be described.

FIG. 1a shows the basic diagram of a conventional bidirectional "buck-boost" converter. In such a converter, a primary circuit and a secondary circuit are arranged on either side of an inductance L. The primary circuit includes a diode Dp and a chopping switch Tp assembled in parallel, the assembly being interposed between a supply voltage source Vin and inductance L. Similarly, the secondary circuit includes a diode/chopping switch assembly Ds/Ts interposed between inductance L and an output capacitor Cout. Capacitor Cout provides the smoothing of the output voltage Vout of the converter, applied to a load Z to be supplied. In practice, switches Tp, Ts, are electronic switches, such as MOS transistors or bipolar transistors.

As mentioned previously, the operation of the converter occurs in cycles of two periods, each cycle including a first so-called accumulation period, of duration Ton, when a current Ip flows through the primary, and a second so-called restitution period, of duration Toff, when a current Is flows through the secondary. FIG. 2 shows the total current I flowing through inductance L for the duration of a cycle. In bidirectional operation mode, so-called accumulation period Ton actually includes a first phase Ton1 of restitution in voltage source Vin of an excess energy accumulated in inductance L during a previous cycle, followed by a phase Ton2 of effective accumulation of magnetic energy in inductance L. FIGS. 1b and 1c show equivalent diagrams of the converter during phases Ton1, Ton2. During Ton1, inductance L generates current Ip which is negative (diode Dp conducts, FIG. 1b). When this energy has been entirely restituted, accumulation phase Ton2 begins, where Ip is positive (Tp is on, diode Dp is blocked, FIG. 1c). Similarly, so-called restitution phase Toff first includes a phase Toff1 of effective restitution in capacitor Cout and load Z of the energy stored by inductance L during Ton2, followed by a phase Toff2 of accumulation in inductance L of an excess energy supplied to capacitor Cout or to load Z during Toff1. FIGS. 1d and 1e show equivalent diagrams of the converter during phases Toff1, Toff2. It can be seen that secondary current Is is positive during Toff1 (diode Ds conducts, FIG. 1d), and then negative during Toff2 (Ts on, diode Ds blocked, FIG. 1e), load Z or capacitor Cout acting as a voltage generator. The energy stored during Toff2 is transferred to voltage source Vin during phase Ton1 of the following cycle, which characterizes a bidirectional operation.

A disadvantage of this type of converter is that its efficiency decreases as the operating frequency increases, whereas, contradictorily, it is preferable to choose high operating frequencies, from around 100 kHz to 1 MHz, to reduce the size and the bulk of the converter.

It is well known that the decrease in efficiency with the increase of the operating frequency is especially caused by energy losses in the switches during the switching periods. It should be reminded that the energy lost in a switch during a switching is equal to the product of the voltage across the switch by the current which runs therethrough and the switching time. The switching-on losses have to be distinguished from the switching-off losses. In a converter operating according to the bidirectional mode such as shown in FIG. 2, the problem of switching-on losses of switches Tp, Ts, is solved in principle since each switching on is preceded by a period of conduction of diode Dp, Ds, which guarantees a closing voltage close to 0 (diode voltage). Conversely, each opening of switch Tp, Ts, causes a reaction of the inductive component and an abrupt rise of the voltage across the switch, which increases the switching time of the switch by Miller effect. This phenomenon causes an energy loss in the switches which is all the more substantial as it happens many times in a second when the frequency is high. Moreover, the abrupt rise of the voltage upon switching off causes an emission of parasitic electromagnetic radiation. The same disadvantages also appear in a transformer converter of "fly-back" type, which operates according to the same principle.

To overcome this disadvantage, low loss converters have been provided, where the voltage edges appearing upon opening of the primary and secondary switches are smoothed due to the addition of so-called "smooth switching" capacitors.

FIG. 3 shows a low loss "fly-back"-type converter 10. Converter 10 is for example similar to the converter illustrated in FIG. 15 of European patent application 336725. It differs from the converter of FIG. 1 by the addition of two smooth switching capacitors Cp, Cs, and by a specific operating mode which involves two transition periods which will be described hereafter. Capacitor Cp is added in parallel to the diode/switch assembly Dp/Tp of the primary and capacitor Cs is added in parallel to the diode/switch assembly Ds/Ts of the secondary. Further, as the converter is of "fly-back" type, inductance L of FIG. 1 is replaced with a transformer 1 including a primary inductance Lp formed by a winding of Np turns of coil, and a secondary inductance Ls formed by a winding of Ns turns of coil.

The operation of the converter is illustrated by FIG. 4. FIGS. 4a and 4b show control signals Hp and Hs respectively applied to switches Tp and Ts. FIGS. 4c and 4d show the currents Ip and Is respectively flowing through primary inductance Lp and secondary inductance Ls of the transformer. FIGS. 4e and 4f show voltages VTp and VTs across switches Tp and Ts. FIGS. 4g and 4h show charge or discharge currents Icp and Ics of capacitors Cp and Cs. Finally, FIGS. 4i and 4j show parasitic currents Iop and Ios, which add to the currents of the primary and the secondary Ip and Is shown in FIGS. 4c and 4d.

As it can be seen in FIG. 4, each operating cycle of converter 10 includes four distinct periods which will be designated by their respective durations T1, T2, T3, T4.

Periods T1 and T3 are similar to periods Ton and Toff previously described, except for the fact that the respective currents of the primary Ip and of the secondary Is flow through distinct windings Lp and Ls. Thus, period T1 includes a restitution phase on the primary side where current Ip is negative (FIG. 4c, diode Dp conducting, Tp off or on), followed by an accumulation phase where current Ip is positive (diode Dp blocked, Tp on, Hp=1). Conversely, period T3 first includes a restitution phase on the secondary side where current Is is positive (diode Ds conducting, Ts off or on) followed by an accumulation phase where current Is is negative (FIG. 4d, diode Ds blocked, Ts on, Hs=1). As shown by dotted lines on FIGS. 4a, 4b, during periods T1 and T3, there is a margin of liberty for closing switches Tp and Ts, as long as diodes Dp and Ds are conducting.

Periods T2 and T4 are short duration transition periods during which Tp and Ts are maintained off. In FIG. 4, T2 and T4 are not shown to scale, and are in fact of the order of one tenth or one hundredth of T1 and T3. During these transition periods, capacitor Cp discharges and capacitor Cs charges, and conversely (FIGS. 4g and 4h). Diodes Dp, Ds, are in the blocked state, the energy stored in the transformer is neither transferred to the primary, nor to the secondary.

Those skilled in the art will note that the smooth switching capacitors Cp, Cs, should not be confused with the capacitors that are found is so-called resonance converters, the operating principle of which is not comparable with that of inductive storage capacitors, which are the subject of this description. Here, capacitors Cp, Cs, are not means enabling energy transfer through the converter. They are, conversely, chosen to have small charge or discharge times T2 and T4 with respect to times T1 and T3 during which the energy transfers are performed in the converter.

The advantage of adding transition periods T2, T4, and of involving smooth switching capacitors Cp, Cs, is that upon opening of a switch Tp or Ts, the capacitor Cp or Cs associated with the switch charges progressively and prevents the abrupt rise of voltage VTp or VTs. As shown in FIGS. 4e and 4f, voltage VTp or VTs of the switch will increase during transition period T2 or T4 until it reaches its maximum value, equal to Vin+Vout*Np/Ns for VTp, and Vout+Vin*Ns/Np for VTs. The switching-off losses due to the Miller effect are thus suppressed, or at least considerably reduced.

These converters however have other disadvantages, which will be now described.

Disadvantages of the use of smooth switching capacitors

The applicant has first noticed that despite the smoothing of the rising/falling edges of VTp and VTs, the switchings of the switches remain a source of parasitic electromagnetic radiation. More specifically, it has been noted that the radiation is generated by parasitic currents Iop, Ios, due to a parasitic oscillation phenomenon between smooth switching capacitors Cp, Cs, and parasitic inductances present in the converter, which can be represented as a first inductance lp in series with Lp and a second inductance ls in series with Ls (FIG. 3). Currents Iop and Ios, shown in FIGS. 4i and 4j, appear after each switching of switches Tp, Ts, follow an oscillating state which damps slowly, and exhibit a peak intensity which can be equal to the maximum values reached by Ip and Is at the end of T1 and T3. Current Iop flows through the entire loop formed by the primary circuit, including inductance Lp, the diode/switch/capacitor assembly Dp/Tp/Cp and voltage source Vin, as well as the electric connections between these components. Similarly, current Ios flows through the entire loop formed by the secondary. Thus, each primary or secondary loop emits electromagnetic radiation due to an antenna effect, proportional to a magnetic flow $\Phi$ expressed as $\Phi=S+B$, with B representing the magnetic field created by the parasitic current and S being the surface of the loop.

A first object of the present invention is to attenuate the effect of such parasitic currents, and to provide a converter structure with low radiation.

To achieve this object, the present invention provides to modify the arrangement of the smooth switching capacitors, and to connect them in parallel across the inductive component of the converter. The advantage is that, on the one hand, the smooth switching function of the capacitors is kept and, on the other hand, the smooth switching capacitors form, with the primary and secondary inductances, loops with reduced surfaces and lengths wherein are confined the two oscillation currents Ios, Iop. Thus, magnetic flow $\Phi$ and the parasitic radiation are considerably reduced.

Disadvantages of conventional control systems

Generally, the voltages issued by bidirectional converters are stabilized via a control system of the primary and secondary switches Tp and Ts, which permanently monitors output voltage Vout and compares it with a reference voltage Vref. The desired aim is to maintain output voltage Vout constant, by controlling switches Tp and Ts and durations T1 and T3 of conduction in the primary and the secondary.

In a converter in stabilized state, times T1 and T3 are linked by a general relation which can be found as follows:

(a) during T1, the height $\Delta Ip=Ip2-Ip1$ of the current ramp which flows through the primary winding Lp is expressed as:

$$\Delta Ip = Vin*T1/Lp \qquad (1)$$

where Ip2 is the positive current at the end of period T1, Ip1 the negative current at the beginning of period T1 (FIG. 4c), Vin is the input voltage, and Lp the inductance of the primary winding.

(b) in an equivalent way, during T3, the height $\Delta Is=Is1-Is2$ (FIG. 4d) of the current ramp flowing through the secondary winding Ls is expressed as:

$$\Delta Is = Vout*T3/Ls \qquad (2)$$

(c) the general principle of continuity of energy E in a transformer enables to write that the stored energy at the end of a phase is equal to the transferred energy at the beginning of the next phase. This leads to the following relations: $E=\frac{1}{2}*Lp*(Ip2)^2=\frac{1}{2}*Ls*(Is1)^2$ for the transition from T1 to T3, and $E=\frac{1}{2}*Ls*(Is2)^2=\frac{1}{2}*Lp*(Ip1)^2$ for the transition from T3 to T1. Since, besides, in a transformer, $Lp=Al*Np^2$ and $Ls=Al*Ns^2$, Al being a constant, it can be inferred therefrom that:

$$Np*\Delta Ip = Ns*\Delta Is, \qquad (4)$$

(d) by combining this latter relation with expressions (1) and (2) of ΔIp and ΔIs given at (a), it can be inferred that:

$$\frac{Vout}{Vin} = \frac{NsT1}{NpT3} \qquad (5)$$

This relation gives the ratio which exists between input voltage Vin and output voltage Vout, this ratio being assumed to be constant in the case of a converter in stabilized state. Of course, this relation concerns a "flyback" transformer converter: in the case of a "buck-boost" converter, Ns/Np=1.

Relation (5) can also be written as follows:

$$\frac{T3}{T1} = \frac{NsVin}{NpVout} \qquad (6)$$

Thus, the ratio T3/T1 is always constant for a stabilized output voltage Vout and a constant input voltage Vin, whatever the control method used.

Examples of control systems based on this general operating principle are described in above-mentioned European patent application 336725, in relation with FIGS. 12, 14, 15 of this application. According to prior art, it is known to control the duration of the closing of primary switch Tp based on an error signal ε generated by comparing output voltage Vout with a reference voltage Vref. It is also known to trigger the opening of secondary switch Ts (which marks the end of period T3) when current Is flowing through the secondary exceeds a given threshold (current control at the secondary) or when output voltage Vout falls beyond a given value.

One of the disadvantages of known control systems is that they do not give an optimal efficiency on a wide range of values of input voltage Vin. FIG. 5 illustrates the curve of efficiency according to the variations of the input voltage of a converter controlled in a conventional way. It can be seen that the efficiency, which is optimal for a nominal value of the input voltage, deteriorates as Vin increases. This phenomenon is attributed to an increase in the amplitude of current ramps ΔIp, ΔIs, in the converter and to losses by Joule effect. This disadvantage becomes particularly disturbing when there is no stable supply source. For example, in the case of an aircraft, the nominal voltage Vin distributed by the aircraft network is around 28V but can vary between 12V and 36V or more (up to 80V in the case of a network failure). In such operating conditions, the efficiency of a converter is difficult to control.

Another disadvantage of some known control systems is that they are based on both a monitoring of the primary current Ip and a monitoring of the secondary current Is, and that they require at least two current sensors, one being placed at the primary, the other at the secondary.

A second object of the present invention is to provide a control system of a bidirectional converter which offers the following advantages:

an optimal efficiency on a wide range of values of input voltage Vin, in the case of a voltage Vin which is not constant, the possibility of setting output voltage Vout on a wide range of values while maintaining an optimal efficiency, the monitoring of a single side of the circuit, to limit the number of current sensors. This will be preferably current Ip on the primary side, for practical reasons: the detection of a possible overcharge problem and the control of the starting upon power-on, a totally symmetrical operation: the possibility of accepting at the output a load issuing current.

Disadvantages of the current sensors used for monitoring the currents flowing through a voltage converter As indicated previously, the control of a converter requires a monitoring of the currents flowing through the converter. This monitoring can be performed by current sensors. Given the high operating frequencies and the possibly high currents, low loss current sensors with a short response time are desired.

FIG. 6 shows a current sensor 20 conventionally used in voltage converters or other similar devices. This voltage sensor includes a transformer 21 which has a primary winding Wp, run through by a current ip to be measured, and a secondary winding Ws for measuring this current. The secondary winding Ws is connected, via a diode 22, to a measuring resistor r. Finally, an impedance 23 for demagnetizing transformer 21 (for example a Zener diode or a resistor with a high value) is connected in parallel across Ws. During a measurement period, current ip flows through winding Wp and a current is proportional to ip appears in winding Ws, the ratio between ip and is being determined by the ratio ns/np between the number of turns of coil of Ws and Wp. Current is flows through diode 22 and creates, across measuring resistor r, a voltage V=r*is representative of the current ip to be measured. This measurement period must necessarily be followed by a rest period, where current ip has to be zero, so that transformer 21 demagnetizes. During the rest period, the demagnetization is performed by impedance 23, across which a voltage with a reverse biasing appears. Without the rest period, an increasing error voltage would appear at the output of the current sensor, due to the storage of a magnetizing current in transformer 21 and to the saturation thereof.

The main disadvantage of this current sensor is that it can only detect a current in a single direction, imposed by diode 22. Besides, the magnetic core of the sensor very rapidly reaches saturation when a reverse current with respect to the normal detection direction flows through primary winding Wp. This is particularly disturbing when the positive values of primary current Ip are desired to be measured in a bidirectional converter. Since current Ip is negative before being positive, the sensor is first run through by a reverse current with respect to the normal direction of detection, which rapidly leads the magnetic core of transformer 21 to saturation. When, afterwards, current Ip becomes positive, the output voltage of the sensor, instead of being proportional to Ip as it could be expected, is in fact tainted with error.

SUMMARY OF THE INVENTION

Thus, another object of the present invention is to provides an insulated bidirectional current sensor. Such a sensor can in particular but not exclusively be used in a bidirectional voltage converter, for measuring a current likely to change biasings during a same measurement period.

To achieve this object, the present invention is based on the observation that, in a switch-controlled system such as a bidirectional voltage converter, there exists a relation between the switch control and the flowing of the current to be measured in a circuit portion. Thus, the present invention provides to replace the diode of the conventional sensor with a switch, controlled to be on when a current to be measured is likely to flow through the primary winding of the sensor, and so as to be off when no current is likely to flow through this winding, in order to ensure the demagnetization of the sensor.

More specifically, the present invention provides a current sensor including a transformer including a primary winding and a secondary winding, the primary winding being arranged in a circuit likely to be run through by a current to be measured, an impedance for demagnetizing the transformer and a measuring resistor connected to the secondary winding, in which sensor the measuring resistor is connected to the secondary winding via a switch, the switch is controlled to be on when a current is likely to run through the primary winding, and to be off during a time interval which is sufficient to ensure the demagnetization of the transformer, when no current is likely to run through the primary winding.

Advantageously, the current sensor is applied to measuring a current flowing by periods in a circuit, the periods when the current flows being controlled by means for controlling the circuit, a signal for controlling the switch of the sensor being generated by the means for controlling the circuit so that the switch is on at least during current flow periods and off at least for a time interval outside these periods. This circuit can for example be the primary circuit of a bidirectional voltage converter.

According to an embodiment, the demagnetization impedance is connected in parallel across the secondary winding.

According to an embodiment, the demagnetization impedance is connected in parallel across the switch.

BRIEF DESCRIPTION OF THE DRAWINGS

The following will now be described, as a non-limiting example:
- examples of converters with low parasitic radiation, according to the first object of the present invention,
- a method for controlling a converter according to the second object of the present invention, as well as examples of embodiments of control systems according to this method applied to a converter with low losses, and
- a current sensor according to the present invention, especially usable for detecting a current flowing through a bidirectional converter, in relation with the accompanying drawings, among which.

DETAILED DESCRIPTION OF THE INVENTION

Bidirectional voltage converter with low parasitic radiation

Figure 1A:
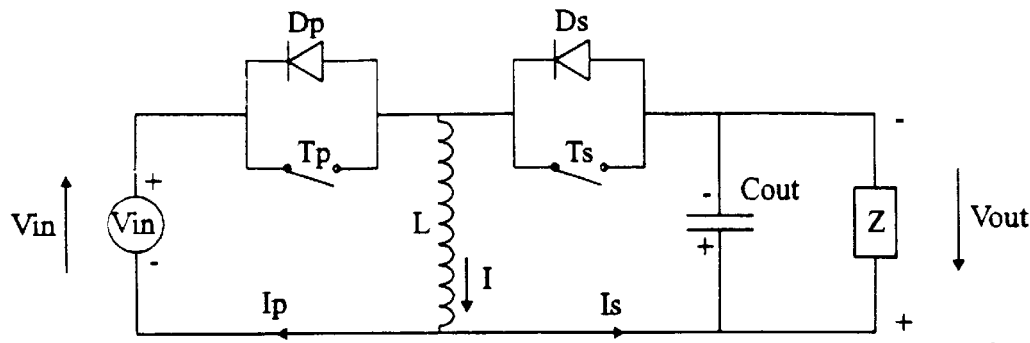
FIG. 1a shows the electric diagram of a bidirectional voltage converter according to prior art, of "buck boost" type.
Figure 1B:
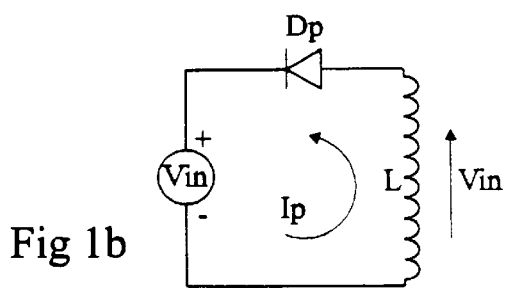
FIGS. 1b to 1e are equivalent electric diagrams showing the converter of FIG. 1 during four operating phases.
Figure 1C:
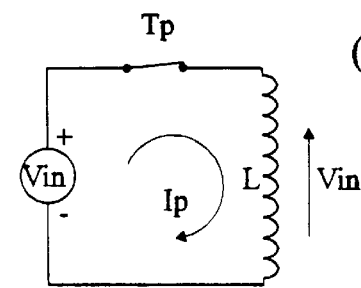
Figure 1D:
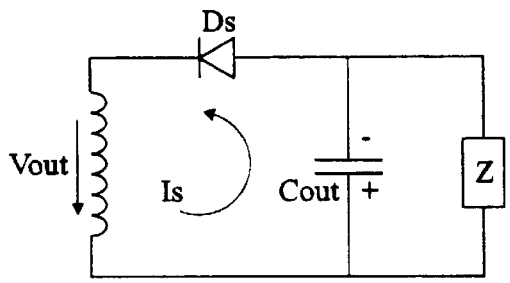
Figure 1E:
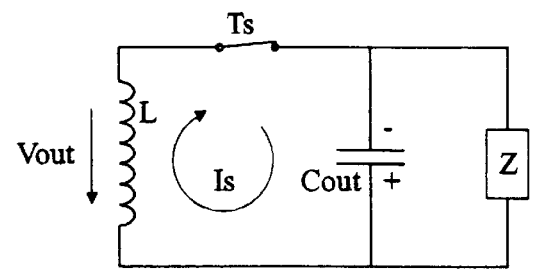
Figure 2:
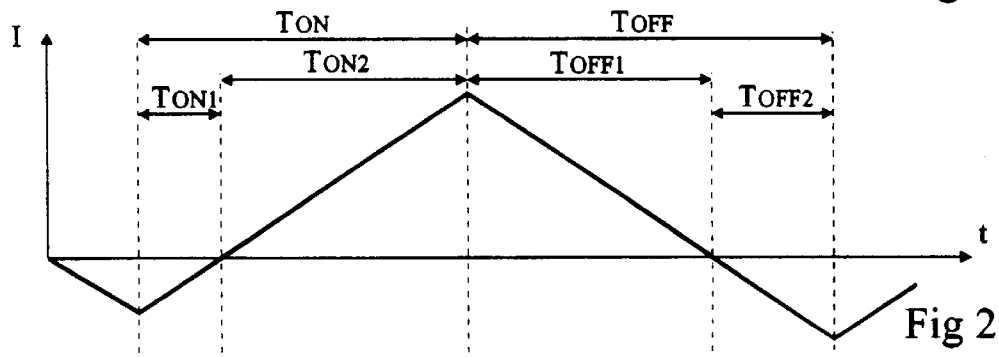
FIG. 2 is a current diagram illustrating the operation of the converter of FIG. 1a, FIG. 3 shows the electric diagram of a bidirectional voltage converter according to prior art, with low losses and of "fly-back" type.
Figure 3:
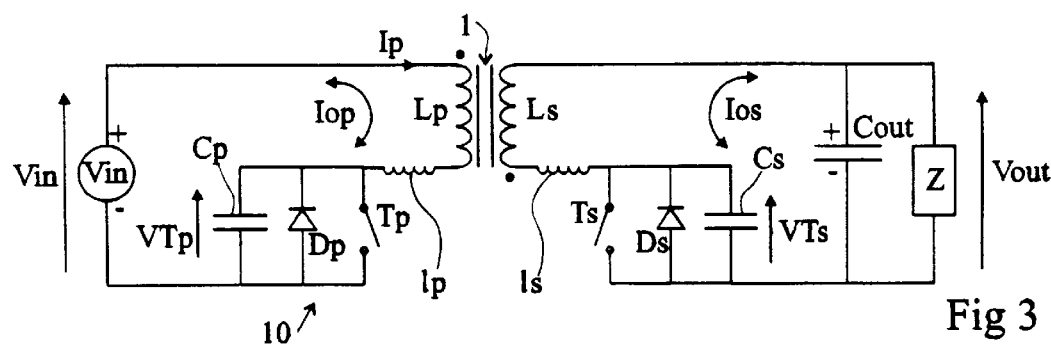
Figure 7:
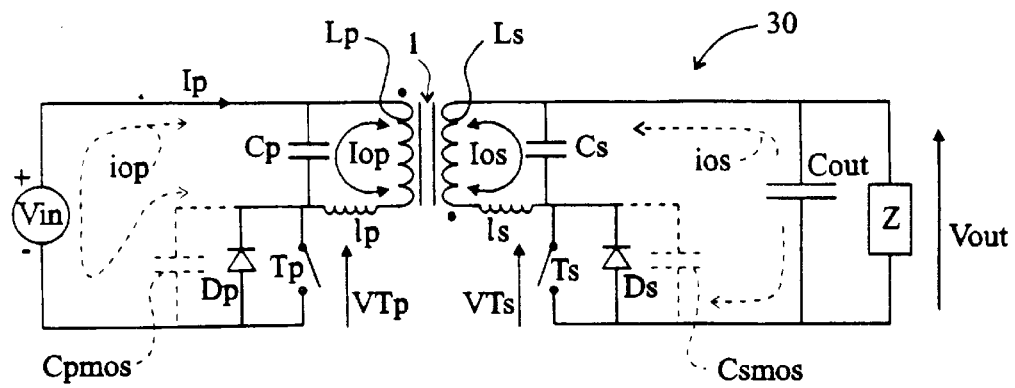
FIGS. 7, 8, 9A and 9B show the electric diagrams of four bidirectional voltage converters with low parasitic radiation, according to the present invention.

FIG. 7 shows a converter 30 according to the present invention, here of "fly-back" type. It includes the components of the conventional converter already described in relation with FIG. 3, referred to by the same reference numbers. It should be reminded that the present invention here aims at reducing electromagnetic radiation due to parasitic currents Iop, Ios, created by a resonance phenomenon between smooth switching capacitors Cp, Cs, and parasitic inductances lp, ls, present in the converter. According to the present invention, converter 30 differs from the prior art converter in that capacitor Cp is connected in parallel across primary inductance Lp, and capacitor Cs is connected in parallel across secondary inductance Ls.

As it can be seen in FIG. 7, the advantage of this arrangement is that capacitors Cp, Cs, form, with inductances Lp, Ls, and their parasitic inductances lp, ls, two loops of reduced lengths and surfaces, one at the primary, the other at the secondary, wherein are confined currents Iop and Ios. Thus, current Iop does not run through the entire loop formed by the primary circuit with supply source Vin, and current Ios does not run through the entire loop formed by the secondary circuit with load Z, which loops can be, in practice, of considerable size due to the conductor lengths. Since parasitic electromagnetic radiation is proportional to the surface of each of the loops, its intensity is considerably decreased.

Figure 4:
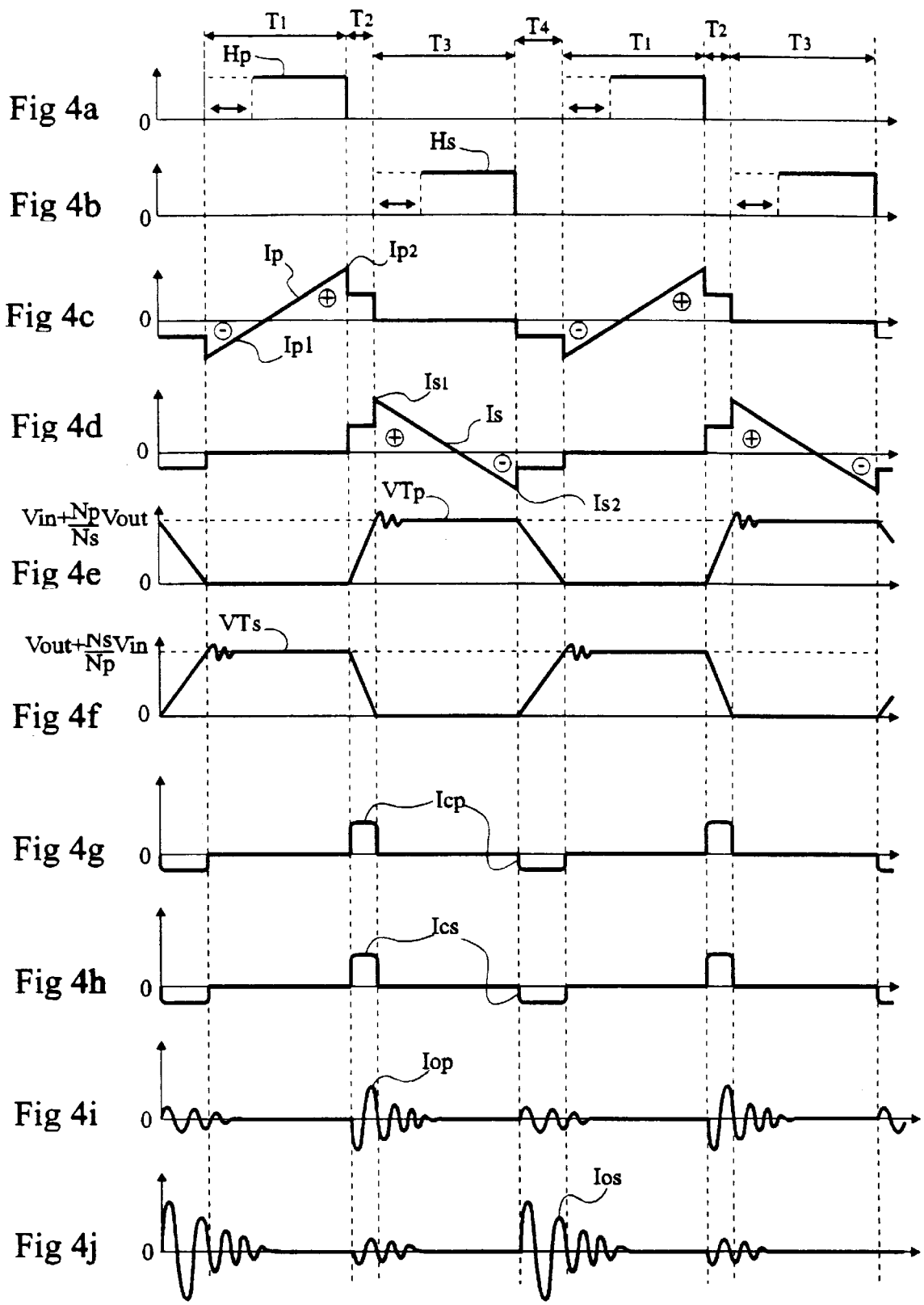
FIGS. 4A to 4J illustrate electric signals appearing in several points of the converter of FIG. 3.
Figure 5:
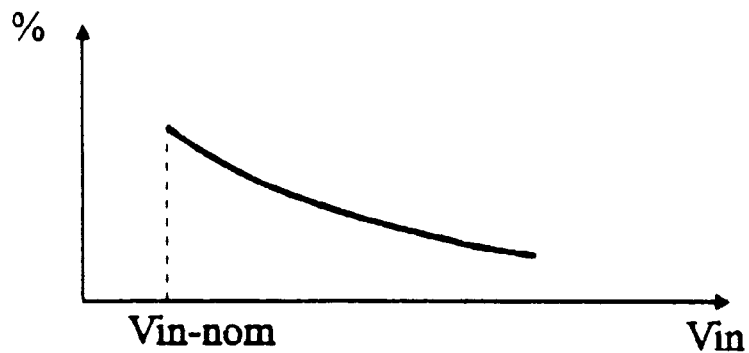
FIG. 5 shows a curve of the efficiency according to the input voltage of the bidirectional converters according to prior art.
Figure 6:
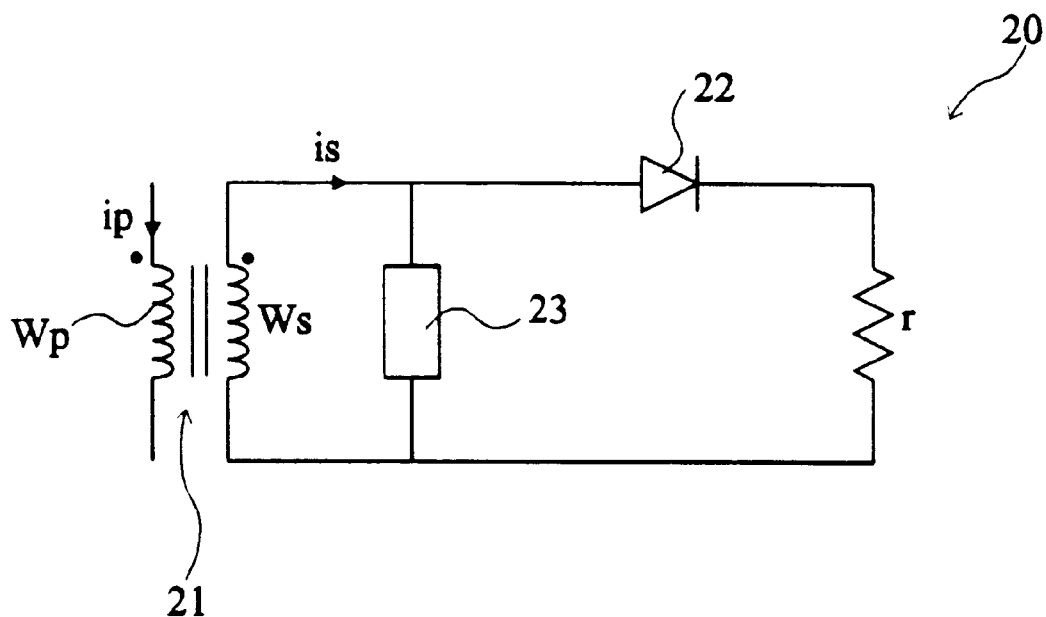
FIG. 6 shows the electric diagram of a current sensor according to prior art.

Another advantage is that the operation of converter 30 is not modified, with capacitors Cp, Cs, still ensuring their function of smoothing the rising edges of voltage VTp, VTs, across the switches. Thus, all signals shown in above-described FIG. 4 are unchanged.

Still another advantage of the present invention is the ability to use capacitors Cp, Cs, with a lower nominal voltage, and reduced cost and bulk. This advantage will be better understood with the exemplary description of the operation of primary capacitor Cp. When switch Tp switches from the on state (period T1) to the off state (period T2), the voltage across Cp, first equal to Vin (VTp=0), decreases, becomes zero, and then increases again according to a reverse biasing until it reaches a negative value Vout*Np/Ns imposed by inductance Lp. In prior art, the voltage of Cp followed that of switch Tp and would range from 0 to +(Vin+Vout*Np/Ns). The voltage deviation of capacitor Cp is thus the same, but the maximum voltage which can settle across it is much lower due to the arrangement according to the present invention. This maximum voltage is equal to Vin, or to Vout*Np/Ns.

Figure 8:
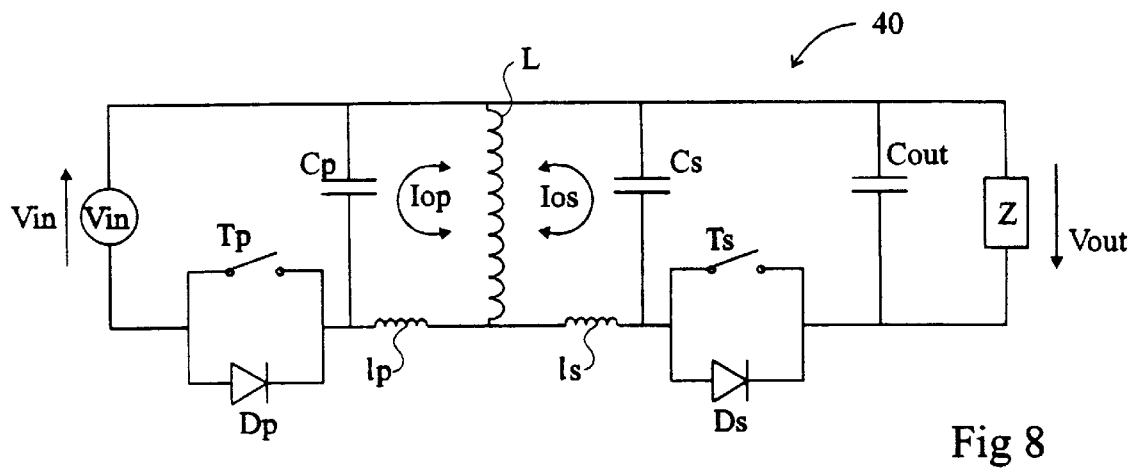
Figure 9A:
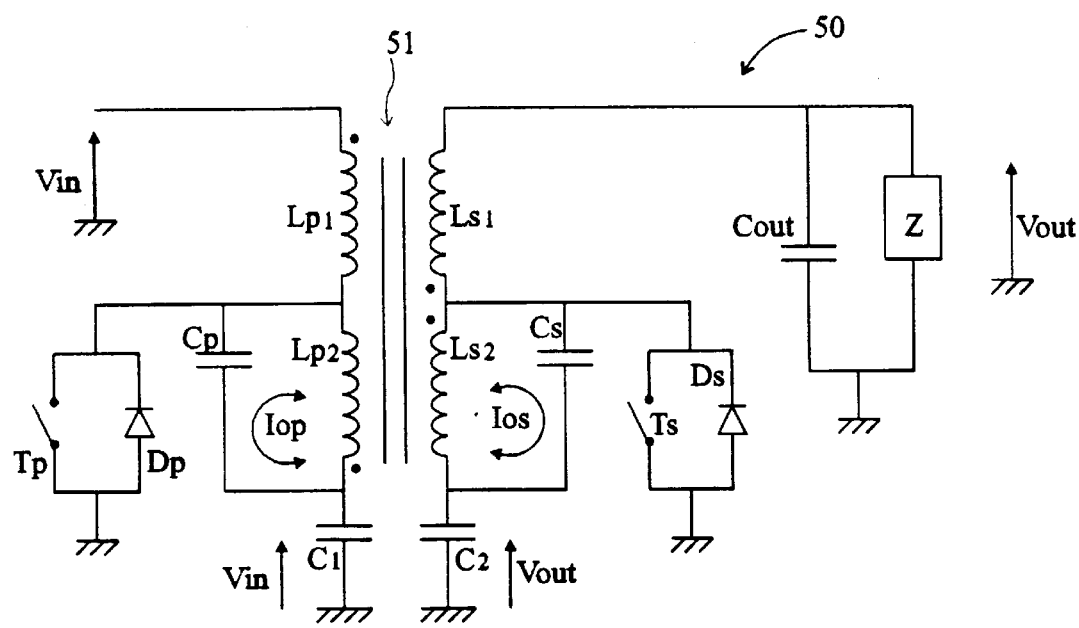
Figure 9B:
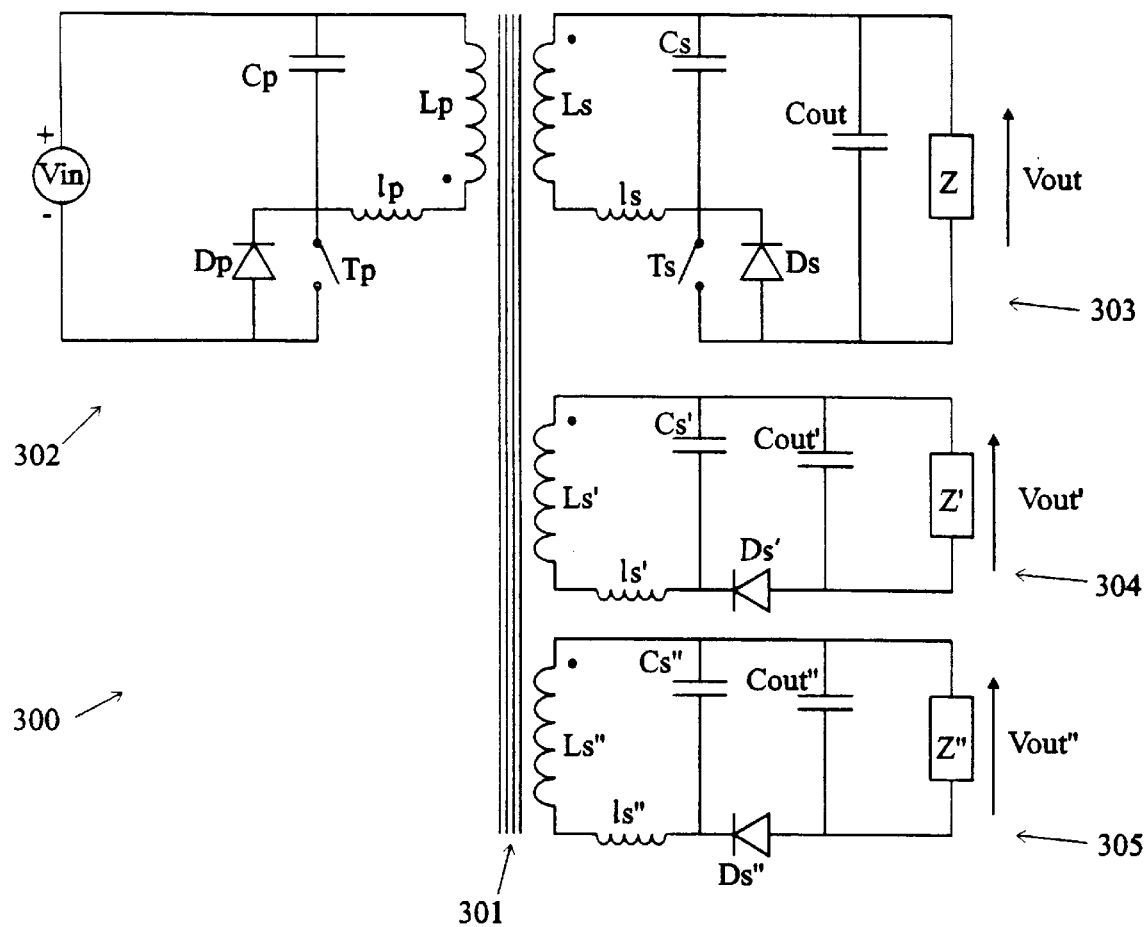

The present invention can also be applied to other types of non-resonant converters with low losses, as shown in FIGS. 8 and 9 and 9B.

FIG. 8 shows a "buck-boost" type converter 40, including the same components as the converter described in relation with FIG. 1, referred to by the same reference numbers. Two parasitic inductances lp, ls, of the converter have been shown, in series with inductance L, respectively at the primary and at the secondary. Converter 40 includes two smooth switching capacitors Cp, Cs, and operates according to a four period cycle already described. According to the present invention, capacitors Cp and Cs are connected in parallel across inductance L, Cp being connected on the primary side and Cs on the secondary side.

FIG. 9A shows an inductive storage converter 50 of a specific type, including the primary and secondary switches and diodes Tp, Ts, Dp, Ds, controlled as in the previous cases. The converter 50 includes a transformer 51. The transformer 51 includes series-connected first and second primary windings Lp1, Lp2 being respectively wound in opposite directions and series-connected first and second secondary windings Ls1, Ls2 also respectively wound in opposite directions. At the primary, input voltage Vin is applied to winding Lp1, winding Lp2 is connected to the ground via a first capacitor C1, the Tp/Dp assembly is connected between the midpoint of Lp1 and Lp2 and the ground. At the secondary, output capacitor Cout in parallel with the load Z to be supplied are connected on the one hand to Ls1, and on the other hand to Ls2 via a second capacitor C2. Assembly Ts/Ds is connected between the midpoint of Ls1 and Ls2 and the ground. At the primary as well as at the secondary, the winding directions of Lp1 and Lp2, Ls1 and Ls2 being inverted, the voltages across Lp1 and Lp2, Ls1 and Ls2, cancel each other. Voltage Vin is thus present across capacitor C1, and voltage Vout is present across capacitor C2. According to the present invention, smooth switching capacitor Cp is connected in parallel across the second primary winding Lp2, and capacitor Cs is connected in parallel across the second secondary winding Ls2. As seen from its input or its output, the operation of converter 50 is identical to that of the converter of FIG. 7.

FIG. 9B shows a converter 300 with multiple outputs, implemented based on a transformer 301 including a primary winding Lp and several secondary windings Ls, Ls', Ls". Each winding has a parasitic inductance, respectively lp, ls, ls', ls". In converter 300, a primary circuit 302 attached to winding Lp and a first secondary circuit 303 attached to secondary winding Ls can first be distinguished. Primary circuit 302 and the first secondary circuit 303 are absolutely identical to the primary circuit and the secondary circuit of the converter of FIG. 7 and will not be described again. Converter 300 further includes second and third secondary circuits 304 and 305, attached to windings Ls' and Ls". Secondary circuits 304 and 305 have the same structure as secondary circuit 303 but do not include switches. Winding Ls' attaches a load Z' via a diode Ds' and a filtering capacitor Cout', and winding Ls" attaches a load Z" via a diode Ds" and a filtering capacitor Cout". According to the present invention, a capacitor Cs' is connected in parallel across Ls' and a capacitor Cs" in parallel across Ls".

Those skilled in the art will note that, in the various converters which have just been described, the use of MOS transistors as switches Tp, Ts, does not hinder the obtaining of the advantages of the present invention. When switches Tp, Ts, are MOS transistors, they exhibit at their terminals parasitic capacitors Cpmos, Csmos, inherent to MOS technology and shown as an example and in dotted lines in FIG. 7. Then, by oscillation between Cpmos, Csmos, and parasitic inductances lp, ls, parasitic currents iop, ios, appear, which flow through the entire primary circuit and secondary circuit, and it could be feared that such currents are the source of significant parasitic radiation. In fact, currents iop and ios are drawn from currents Iop and Ios confined in the loops with reduced lengths according to the present invention, and are proportional to the latter in ratios equal to Cpmos/Cp for iop, and Csmos/Cs for ios. Since Cpmos and Csmos are low and around 500 pF, it is sufficient to choose capacitors Cp and Cs with a greater value, for example equal to 5 times Cpmos or Csmos, for ios and iop to be negligible.

Method and system for controlling a bidirectional voltage converter

As indicated in the preamble, the second object of the present invention is to provide a method and a system for controlling a bidirectional converter, which especially provides the following advantages:

an optimal efficiency on a wide range of values of input voltage Vin, the possibility of setting output voltage Vout according to a wide range of values while keeping an optimal efficiency, the possibility of only providing a monitoring of the current on the primary side, in order to limit the number of current sensors, a perfectly bidirectional operation.

Figure 10:
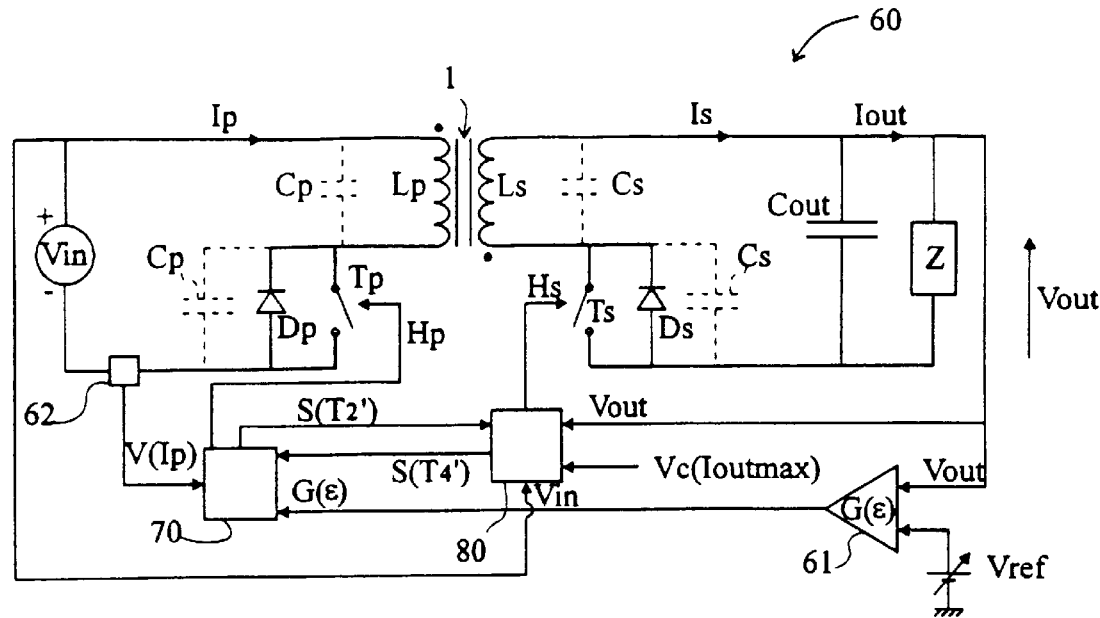
FIG. 10 shows the electric diagram of a bidirectional voltage converter and, in the form of blocks, a system for controlling this converter according to the present invention.

FIG. 10 shows a converter 60 according to the present invention, here of "fly-back" type. In its structure, converter 60 does not differ from the conventional converter of FIG. 3. It includes all the components already described, that is, transformer 1 and the two inductances Lp, Ls, primary switch Dp/Tp and secondary switch Ds/Ts, as well as output capacitor Cout, load Z and voltage source Vin. Smooth switching capacitors Cp, Cs, can be placed as shown in dotted lines, that is, conventionally or as described previously.

Converter 60 is driven by a control system according to the present invention which includes an amplifier 61, a circuit 70 issuing a signal Hp for controlling primary switch Tp, and a circuit 80 issuing a signal Hs for controlling secondary switch Ts. Amplifier 61 is a control loop amplifier of conventional type. It receives as an input output voltage Vout of converter 60 as well as a settable reference voltage Vref, and issues to circuit 70 a voltage G(s) which is a function of the difference or error $\epsilon$ between voltage Vout and reference voltage Vref. Circuit 70 further receives a voltage V(Ip) representative of the current Ip flowing through the primary circuit, issued by a current sensor 62 arranged in series with switch Dp/Tp.

An operating cycle of converter 60 includes periods T1, T2, T3, T4, already described in relation with FIG. 4. The converter control is ensured by the control system in the following manner. During period T1, primary switch Tp is on and Ts is off. Circuit 70 compares V(Ip) to G($\epsilon$) and opens switch Tp when current Ip in the primary reaches a value such that V(Ip) becomes higher than or equal to G($\epsilon$). Thus, the control mode chosen for primary switch Tp consists of controlling the maximum current Ip2 (FIG. 4c) of the current ramp in the primary circuit. The opening of Tp, which corresponds to the end of period T1, causes the beginning of period T2, when Tp and Ts are left off. At the end of T2, circuit 70 sends to circuit 80 a signal S(T2'). According to the present invention, when the circuit receives signal S(T2'), it closes secondary switch Ts and counts a time T3. When the counting of T3 is over, circuit 80 opens switch Ts, which corresponds to the beginning of period T4. At the end of T4, circuit 80 sends a signal S(T4') of end of period T4 to circuit 70, which will then start the following cycle by closing Tp. After a starting period following the powering-on of the converter, Vout settles at a value close to Vref. The output voltage can thus be chosen by an appropriate setting of Vref.

A remarkable characteristic of the present invention which appears in the above description of the control circuit is that the opening of secondary transistor Ts is determined only by a counting of time T3. Further, according to the present invention, time T3 is not set arbitrarily, but determined by a relation which leads to the desired advantages. A method for determining T3 will now be described.

The present invention first provides to search for a relation enabling to express T3 as:

$$T3=f(Vin, Vout, Ioutmax),$$

Vin being the input voltage of the converter, Vout the output voltage and Ioutmax a maximum value of the current Iout likely to flow from the converter into load Z, or to be received from load Z (FIG. 11). The operation being bidirectional, this current can indeed be positive (+Ioutmax) or negative (−Ioutmax).

It should be previously reminded that general relations (2) and (6) as set forth above, relative to the height ΔIs of the current ramp Is in the secondary (FIG. 4d) and to the ratio between T3 and T1 are the following:

$$\Delta Is = Is1 - Is2 = Vout*T3/Ls, \qquad (2)$$

and $$\frac{T3}{T1} = \frac{NsVin}{NpVout} \qquad (6)$$

Since current Is in the secondary has the shape of a current ramp of height ΔIs (FIG. 4d), the mean output current Iout flowing from the converter can be expressed as:

$$Iout=\tfrac{1}{2}(Is1+Is2)*T3/(T1+T3), \qquad (7)$$

neglecting T2 and T4 which should be added to T1 and T3 in the denominator. Further, current ramp ΔIs flowing through the secondary must not have any value, and can be defined based on the following imperatives:

(A) if a smooth switching upon closing of the switches is desired, diodes Dp and Ds must be conducting, for each cycle, before the closing of the switches, at least for a very short time. This means that there must be a period of inversion of the direction of current Is. In other words, Is1 must always be positive, even if Is1 is very close to 0, and Is2 must always be negative, even if Is2 is very close to 0.

(B) if it is desired to guarantee an optimal and homogeneous efficiency by limiting Joule effect losses as well as iron losses, the height ΔIs of current ramp Is must be controlled and contained within a certain contour, (C) a simple way of obtaining the result aimed at at (B) consists of searching a control mode guaranteeing that ramp height ΔIs is a constant independent from output current Iout, for constant values of Vin, Vout.

Based on the three conditions (A), (B), (C), the shape of ramp ΔIs can be defined as shown in the diagrams of FIG. 11. In FIG. 11(a), an extreme case has been shown, which corresponds to a maximum output current Iout (Iout=+Ioutmax, maximum output load). In this case, Is2, is almost zero but is negative, current Is1 reaches the upper limit of a contour defined by values +ΔIs and −ΔIs, and it can be seen that Is1=+ΔIs. In FIG. 11(b), another extreme case, opposite to the first case, is shown, which is that of a load Z which restores energy into the converter (Iout=−Ioutmax). Is1 is almost zero but is positive, Is2 reaches the lower limit of the contour and Is2=−ΔIs. In FIG. 11(c), a mean case is shown, where current ramp ΔIs (which is constant according to hypothesis (C)) is located in the median part of the contour. In this latter case, output current Iout is zero (no output loads). FIGS. 11d and 11e, given only to make things clearer, show entirely positive or entirely negative shapes of ramps of current Is that the present invention aims at avoiding, according to condition (A). Should the case of FIGS. 11d and 11e occur, there would be no conduction phases for diodes Dp and Ds and no smooth switching upon closing of switches Tp, Ts.

ΔIs being now defined, it can be seen that when output current Iout is at its maximum (Iout=Ioutmax, FIG. 11a), $$\Delta Is = Is1 \qquad (8)$$

Besides, still in the case where output current Iout is at its maximum, relation (7) becomes $$Iout=Ioutmax=\tfrac{1}{2}*Is1*(T3/(T1+T3)) \qquad (9)$$

By combining relations (8) and (9), we have $$Ioutmax=\tfrac{1}{2}*\Delta Is*(T3/(T1+T3)) \qquad (10)$$

By combining relation (6) and relation (10), we have $$Ioutmax=\tfrac{1}{2}*\Delta Is*[(Nsp*Vin)/(Vout+(Nsp*Vin))]. \qquad (11)$$

Nsp representing ratio Ns/Np.

By combining relation (11) and relation (2), we have $$T3=2[Ioutmax*Ls/Vout]*[(Vout+Nsp*Vin)/(Nsp*Vin)]. \qquad (12)$$

The desired relation T3=f(Vout, Vin, Ioutmax), implemented by circuit 80 of FIG. 10, is thus obtained. Since parameters Ls and Nsp are constants, they are taken into account in the constitution of circuit 80. Since parameters Vin, Vout and reference Ioutmax are variables, relation (12) can be implemented according to the options described hereafter.

A first option consists of calculating T3 based on two fixed parameters Vin# and Vout#, Vin# being chosen to be equal to the minimum voltage that the source of supply voltage Vin is assumed to issue, Vout# being chosen to be equal to reference voltage Vref of the control. In this case, circuit 80 is "blind" and does not know the real operating conditions of the converter. The converter will however operate satisfactorily if input voltage Vin does not vary according to a too wide range of values.

A second option consists of calculating T3 based on parameter Vout# and the real value of Vin taken at the input of the converter. In this case, circuit 80 is likely to adapt to important fluctuations of Vin while keeping an optimum efficiency.

A third option consists of calculating T3 based on the real values of Vin and Vout, taken at the input and at the output of the converter. In this case, the converter operates in a self-adapting manner, the efficiency remaining optimal even in case of important fluctuations of Vin or of modifications of the reference Vref which determines Vout.

Figure 12:
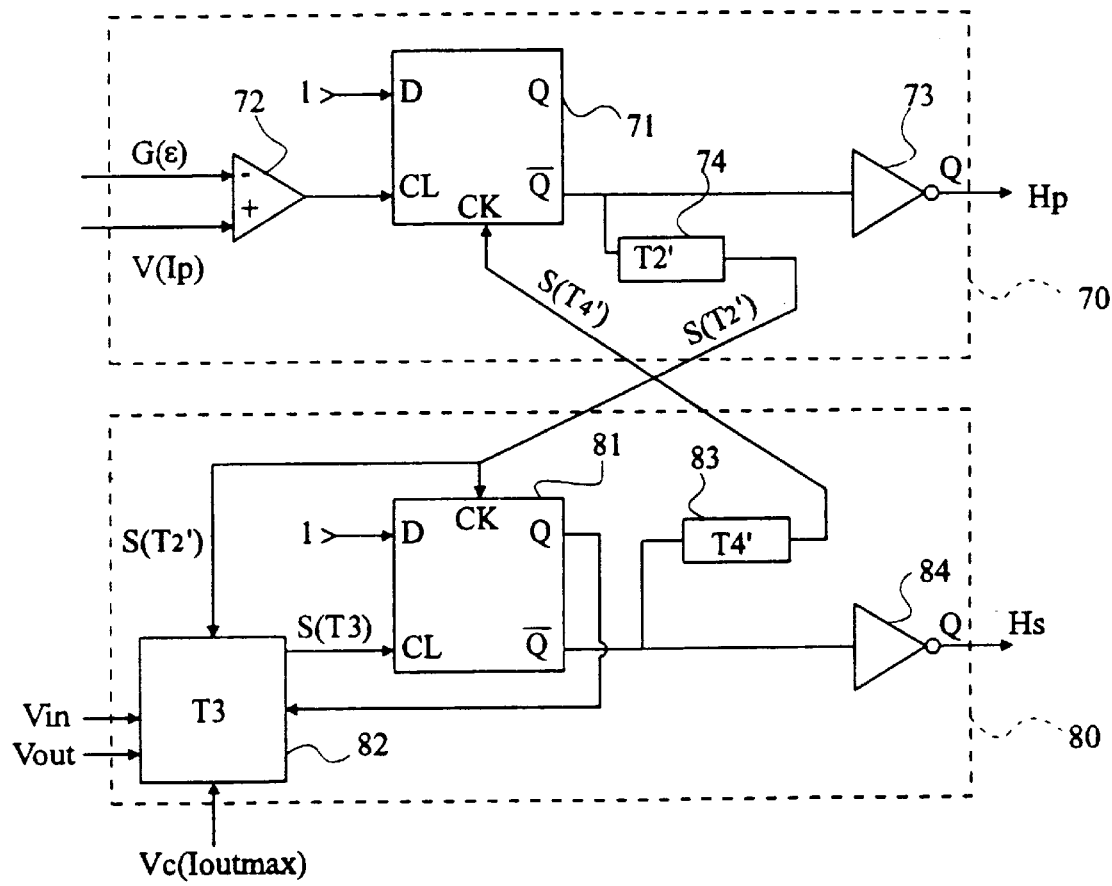
FIGS. 12 and 13 are electric diagrams showing in more detail blocks of FIG. 10.
Figure 11A:
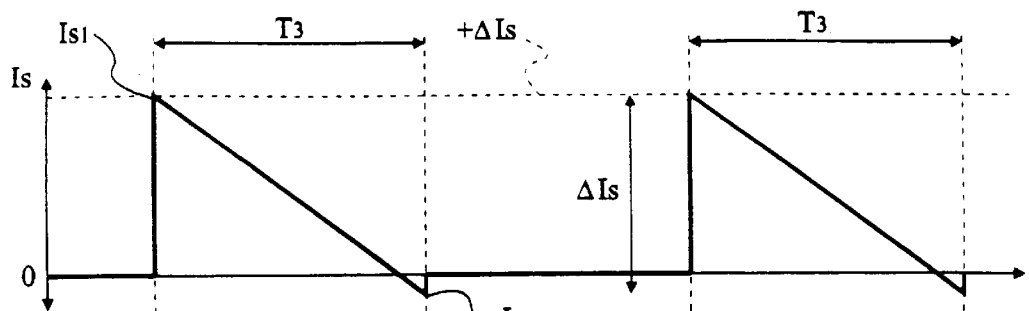
FIGS. 11a–11e illustrate current ramps in the secondary circuit of a converter.
Figure 11B:
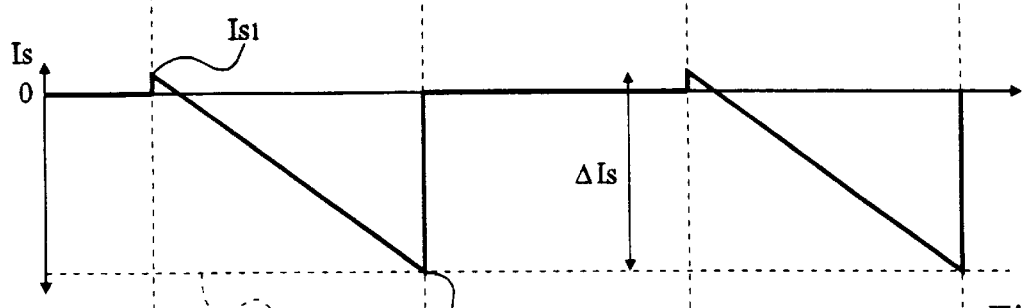
Figure 11C:
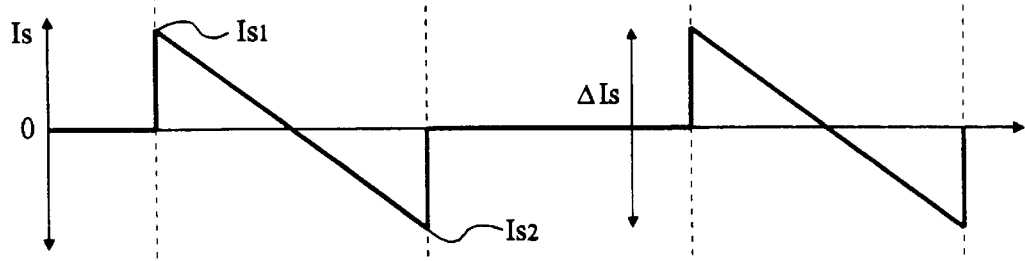
Figure 11D:
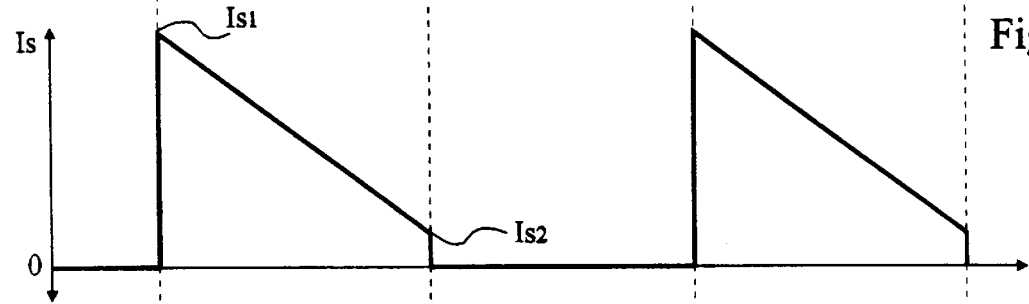
Figure 11E:
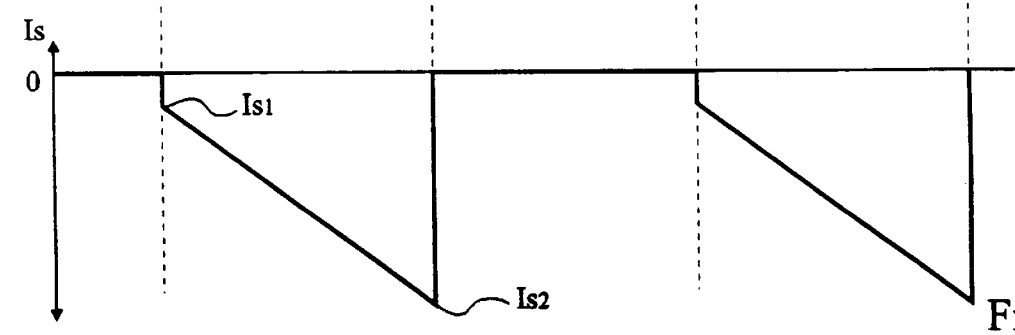

FIG. 12 shows an example of embodiment of circuits 70 and 80 according to the third option.

Circuit 70 includes a logic flip-flop 71 of D flip-flop type, and a comparator 72 receiving signal V(Ip) on its positive input and signal G($\epsilon$) on its negative input. The D input of flip-flop 71 is maintained at 1, the flip-flop reset input CL receives the output of comparator 72, and the clock input CK receives signal S(T4') issued by circuit 80. The control signal Hp of switch Tp is issued by an inverting cell 73 receiving as an input the flip-flop inverse output /Q. Output /Q is also applied at the input of a delay line 74 issuing signal S(T2'). The output of delay line 74 represents the input with a delay T2'.

Circuit 80 includes a D flip-flop 81 and a circuit 82, calculating T3 according to relation (12) and issuing a signal S(T3) when T3 is over. For this purpose, circuit 82 receives as inputs input voltage Vin, output voltage Vout, and a reference voltage Vc representing the current reference Ioutmax. Circuit 82 also receives as an input signal S(T2') issued by circuit 70, and the output Q of flip-flop 81. Finally, flip-flop 81 is arranged as follows. Input D is maintained at 1, input CL receives signal S(T3) sent by circuit 82, clock input CK receives signal S(T2'). The inverse output /Q is applied to a delay line 83 with a delay T4' which issues S(T4'), as well as to an inverting cell 84 which issues signal Hs for controlling switch Ts.

Circuits 70 and 80 operate as follows. Upon reception of a rising edge of signal S(T4'), D flip-flop 71 provides on its output Q the input D which is at 1. The output /Q switches to 0 and Hp switches to 1, which causes the closing of switch Tp. When the current Ip in the converter is such that V(Ip) becomes higher than G($\epsilon$), the output of comparator 72 switches to 1 and the output Q of flip-flop 71 is set back to 0. The output /Q switches to 1, switch Tp opens. This marks the end of period T1. The rising voltage edge which appeared on /Q at the time of the switching to 1 crosses delay line 74 and reaches with a delay T2' the input CK of flip-flop 81 as well as circuit 82. This rising edge is signal S(T2'). The output /Q of flip-flop 81 switches to 0, signal Hs switches to 1 (switch Ts closes) and circuit 82 starts the counting of T3. When time T3 is over, circuit 82 issues a rising edge on its output S(T3). Flip-flop 81 is reset to 0, Hs switches to 0 and switch Ts opens. It is the end of period T3. A rising voltage edge from the output /Q of flip-flop 81 propagates through delay line 83 until it reaches flip-flop 71 with a delay T4'. This rising edge corresponds to signal S(T4') and causes the starting of a new cycle.

Figure 13:
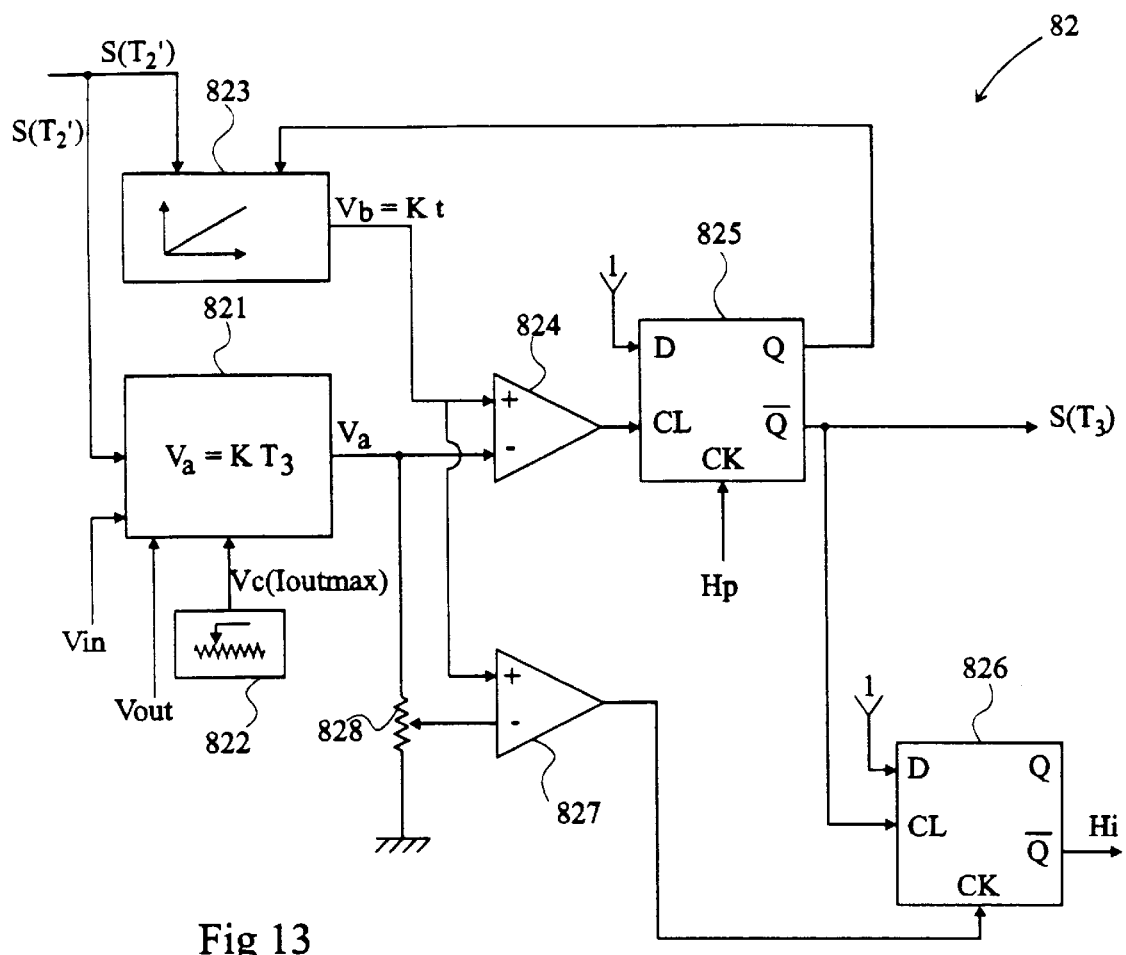

An example of embodiment of circuit 82 is illustrated by FIG. 13. Upon reception of a rising edge of S(T2'), a circuit 821 calculates time T3 according to relation (12) and receives for this purpose Vin, Vout, and reference Vc (Ioutmax) on its inputs. It issues a fixed voltage Va equal to K*T3, K being a constant. A rising edge of S(T2') also triggers in a circuit 823 the generation of a voltage ramp Vb equal to K*t, with t representing time. Va and Vb are compared in a comparator 824, the output of which is attached to the reset input CL of a D flip-flop 825, the D input of which is maintained at 1 and the clock input CK of which receives signal Hp (equivalent to the output Q of flip-flop 71 of circuit 70). The inverse output /Q of flip-flop 825 issues signal S(T3) and the output Q is applied to circuit 823 for setting ramp Vb back to zero.

These several circuits, the implementation of which is within the abilities of those skilled in the art, will not be described. In particular, circuit 821 which calculates T3 according to relation (12) can be implemented conventionally, by means of voltage multipliers and dividers.

In the control system which has just been described, it can be provided that reference Vc (Ioutmax) given to circuit 821 is chosen by the user, which can thus calibrate the converter according to the envisaged application. For example, if it is known that the load will consume little current (Iout), it is advantageous to set Vc at a low value to have a better converter efficiency. Above relation (11) indeed shows that the decrease of reference Ioutmax corresponds to a decrease of ramp ΔIs and, accordingly, to a decrease of Joule effect losses in the converter. The solution shown in FIG. 13 consists of setting Vc by means of a potentiometer 822.

Now referring to diagrams 4c and 4d of FIG. 4, it can be seen that the durations of periods T2 and T4 are determined by the charging or discharging times of smooth switching capacitors Cp and Cs, whereas T2' and T4' are times determined by circuits 70 and 80. In the example of embodiment which has just been described, T2' and T4' are determined by delay lines 74 and 83, and will preferably be chosen with the following precautions:

T2' and T4' must be substantially higher than T2 and T4 so that diodes Dp or Ds are in the conducting state before switches Tp or Ts close, and so as to avoid switching losses upon closing, on the other hand, T2' and T4' have to be very close to T2 and T4, so that switches Tp or Ts are on as soon as possible after the diode associated therewith, Dp or Ds, enters conduction. This precaution enables to have the current flow in priority through the switches and thus to reduce Joule effect losses by still improving the efficiency, the switch voltages, around 0.2 to 0.3 V in the case of MOS switches, being lower than the diode voltages, of around 0.6 to 1 V.

In practice, to choose T2' and T4', a previous estimate of T2 and T4 can be made based on the following relations:

$$T2 = \frac{Vin + NpsVout}{Ip2}(Cp + Nsp^2 Cs) \quad (13)$$

$$T4 = \frac{NspVin + Vout}{-Is2}(Nsp^2 Cp + Cs) \quad (14)$$

wherein Nsp represents ratio Ns/Np and Nps represents ratio Np/Ns.

A disadvantage could however appear in certain operating conditions, especially in the case where large variations of input voltage Vin are likely to occur, or when output voltage Vout is strongly modified by an appropriate setting of Vref. In such operating conditions, it may be difficult to find fixed values for T2' and T4' which are satisfactory in all circumstances, since the real values of T2 and T4, defined by relations (13) and (14), depend on Vin and Vout and are likely to vary.

Figure 14A:
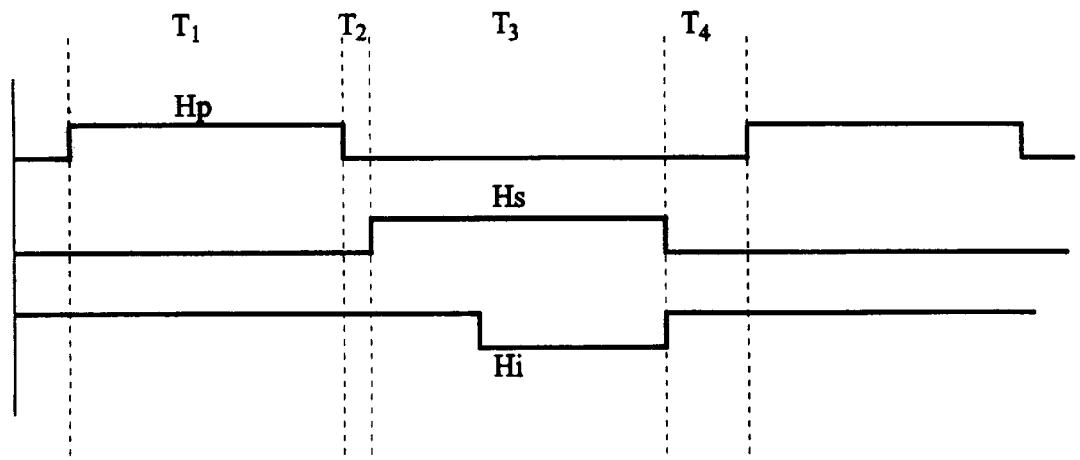
FIG. 14A shows electric signals issued by the control system of FIG. 10.
Figure 14B:
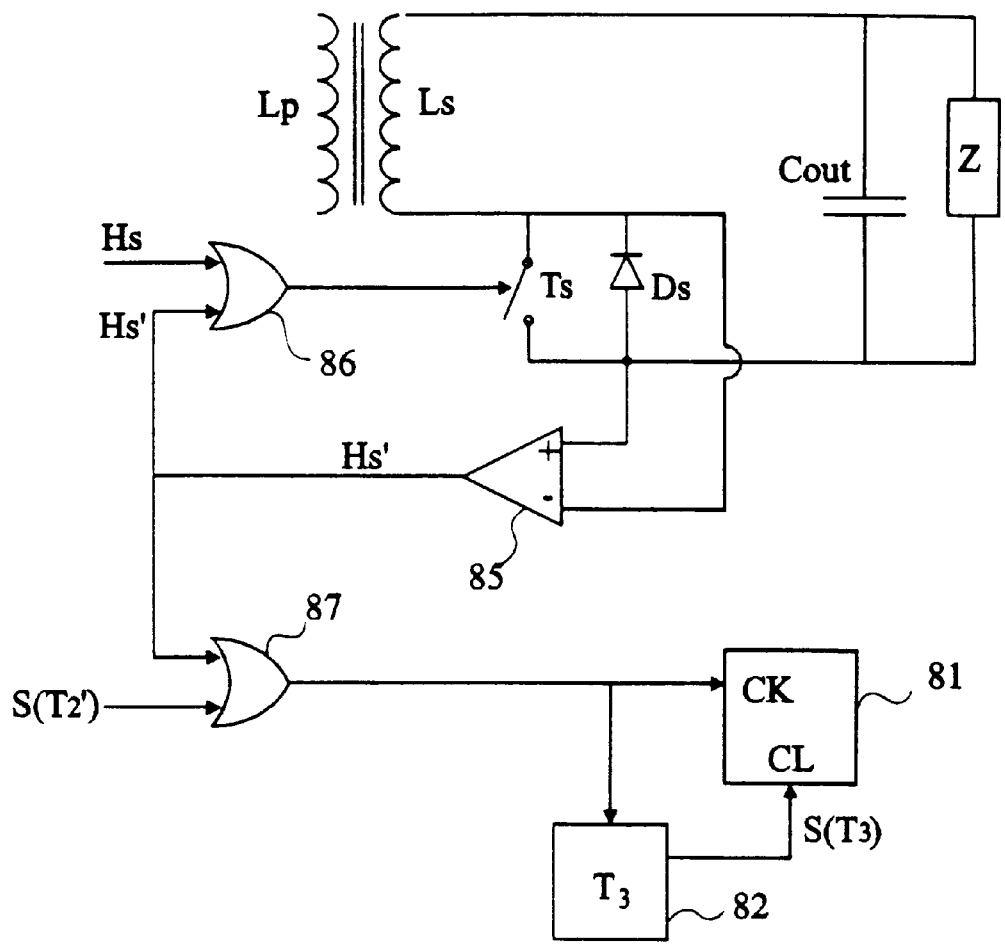
FIG. 14B shows a device added to the converter of FIG. 10.

A first solution to overcome the risks linked with a too big difference between T2', T4', and the real values T2, T4, imposed by the operating conditions of the converter is illustrated by FIG. 14B. For simplicity, only the secondary side of converter 60 has been shown in FIG. 14B. A comparator 85, the positive input of which is connected to the anode and the negative input of which is connected to the cathode of diode Ds, issues a signal Hs'. Signal Hs' is superposed to the normal signal Hs for controlling secondary switch Ts by means of an OR-type logic gate 86, the output of which controls switch Ts. When the "real" period T2 ends, the voltage across diode Ds reverses and Ds becomes conductive. The voltage across Ds, although close to 0 (from −0.6 to −1 V), is sufficient to trigger comparator 85, the output Hs' of which switches to 1. Thus, when Ds becomes conductive, Hs' causes the anticipated closing of Ts if Hs is not yet at 1. Of course, an equivalent device can be added in the primary circuit, to cause the anticipated closing of Tp. Further, as shown in FIG. 14B, signal Hs' can be superposed to signal S(T2') by means of a logic OR gate 87, the output of which replaces signal S(T2') and is attached to Q flip-flop 81 and circuit 82 previously described. This device enables to synchronize the starting of the calculation of T3 upon the anticipate closing of Ts. It should however be noted that as a general rule, these synchronization issues are not of a great practical importance for calculating T3, since times T2, T2', T4, T4', of around a hundred nanoseconds, are very short compared with T1 and T3, of around one microsecond. Thus, a difference of a few tens of nanoseconds between T2' and T2 or T4' and T4 would be insignificant with respect to the duration of T1 or T3.

As an alternative to the above-described solution, the present invention provides a method which consists of replacing delay lines 74 and 83 of FIG. 12 with circuits calculating T2' and T4' in real time according to the above relations (13) and (14). In relation (13), it can be seen that the three parameters required for calculating T2' are Vin and Vout, already used to calculate T3, as well as Ip2. Thanks to the control mode of the closing of primary switch Tp provided by the present invention, Ip2 is given by V(Ip2)=G($\epsilon$) (switching to 1 of comparator 72 of FIG. 12, marking the end of period T1). Thus, all the parameters enabling to calculate T2' are available. As concerns the calculation of T4', it can be seen that relation (14) depends on current Is2, which is the maximum negative current flowing through the secondary at the end of period T3. Current Is2 is not desired to be measured at the secondary, but since $\Delta$Is=Is1−Is2, we have $$\text{Is2}=\text{Is1}-\Delta\text{Is} \tag{15}$$

Now, $\Delta$Is is given by relation (2)

$$\Delta\text{Is}=\text{Is1}-\text{Is2}=\text{Vout}*\text{T3}/\text{Ls}, \tag{2}$$

Vout and T3 being known and Ls being a constant.
Further, Is1 is given by the following relation $$\text{Is1}=\text{NpsIp2}, \tag{16}$$

Ip2 being known and Nps being a constant.

Thus, T4' can also be defined by means of relation (14), based on parameters Vin, Vout, Ip2, T3, which are known.

Figure 15:
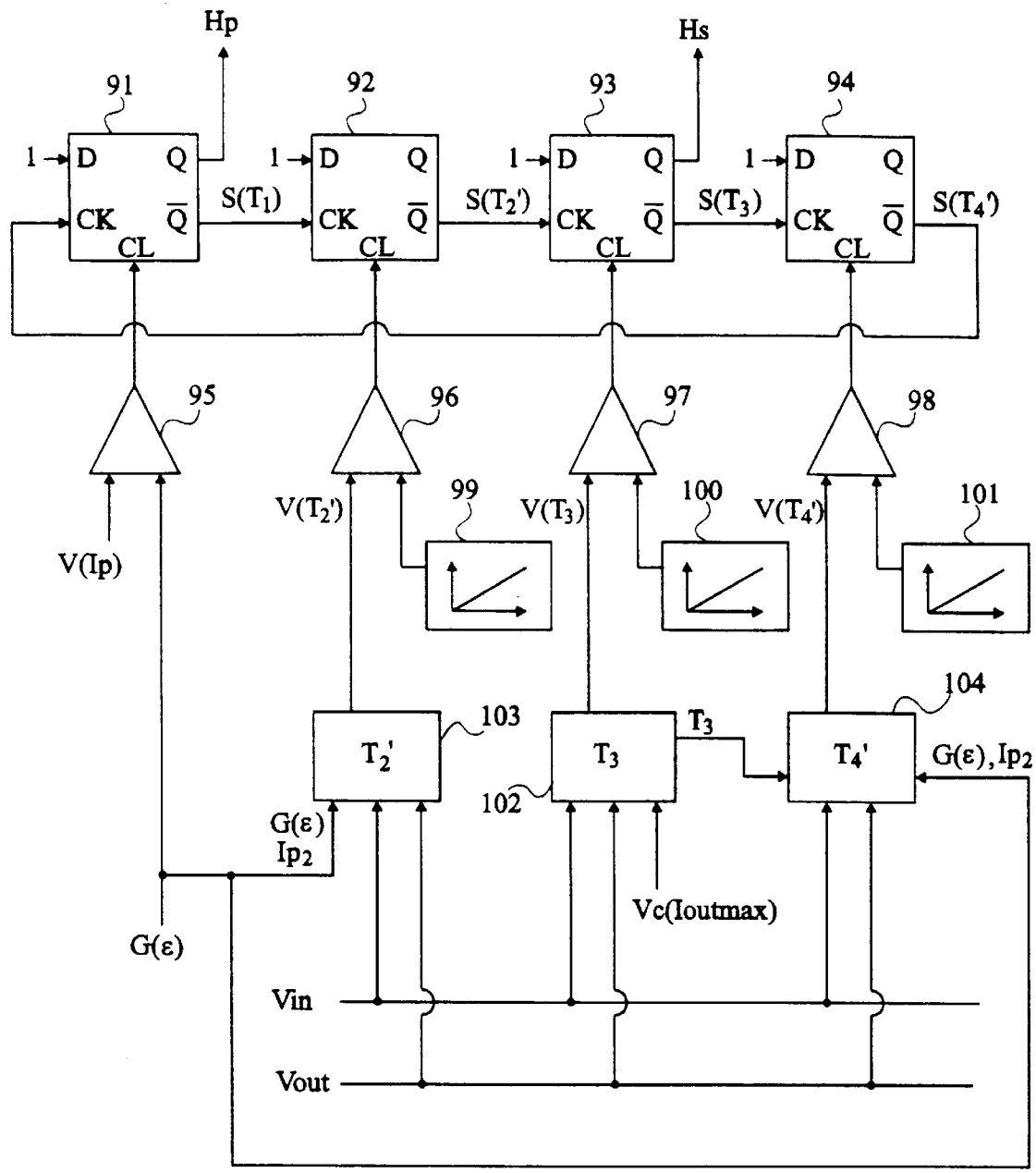
FIG. 15 shows an alternative embodiment of the control system of FIG. 10.

FIG. 15 schematically shows an embodiment of a control system 90 wherein T2', T3, and T4' are determined by calculation. Control system 90 represents the equivalent of circuits 70 and 80 of FIG. 10. It includes four D flip-flops in cascade, respectively 91, 92, 93, 94, each having their D input maintained at 1. The inverse output /Q of the first flip-flop 91 issues a signal S(T1) of end of period T1 to the clock input CK of flip-flop 92. The output /Q of flip-flop 92 issues S(T2') to the input CK of flip-flop 93, the output /Q of which issues S(T3) to the input CK of the last flip-flop 94. Finally, the output /Q of flip-flop 94 issues S(T4') which is brought back to the input CK of first flip-flop 91. Besides, the output Q of the first flip-flop issues control signal Hp and the output Q of the third flip-flop 93 issues control signal Hs. Each reset input CL of flip-flops 91, 92, 93, 94, is attached to the output of a comparator, respectively 95, 96, 97, 98. Comparator 95 receives on its inputs voltage V(Ip) and control signal G($\epsilon$), according to the above-described method for controlling the closing of Tp. Comparator 96 compares a voltage V(T2') representative of T2' with a voltage ramp issued by a circuit 99. Comparator 97 compares a voltage V(T3) representative of T3 with a voltage ramp issued by a circuit 100. Eventually, comparator 98 compares a voltage V(T4') representative of T4' with a voltage ramp issued by a circuit 101. Voltage V(T3) is issued by a circuit 102 similar to circuit 821 of FIG. 13. Voltage V(T2') is issued by a circuit 103 which realizes relation (13) given above, and voltage V(T4') is issued by a circuit 104 which realizes relation (14). For this purpose, circuit 103 receives as inputs Vin, Vout and Ip2 (that is, G($\epsilon$)), and circuit 104 receives Vin, Vout, Ip2, and T3, this latter parameter being given by circuit 102. The operation of the system follows the same principle as that described previously, with the difference that T2' and T4' are obtained by calculation. The advantage is that in case of great variations of input voltage Vin or of a substantial modification of output voltage Vout, the control system according to the present invention will adapt to the new operating conditions by calculating values T2', T4', very close to T2 and T4.

Those skilled in the art will note that control system 90 according to the present invention can have may other improvements. In particular, an improvement consists of making the various relations which preside over the control of the switches even more precise. For example, in relation (7) given above, T2 and T4 have not been taken into account, whereas the relation could be expressed as:

$$\text{Iout}=\tfrac{1}{2}(\text{Is1}+\text{Is2})*\text{T3}/(\text{T1}+\text{T2}+\text{T3}+\text{T4}) \tag{17}$$

By injecting in relation (17) the expressions of T2 and T4 given by relations (13) and (14), a more complete expression of T3 is obtained, which can, like relation (12) be implemented by means of an electronic circuit.

Besides, the control system according to the present invention can be simplified, if low cost applications where the converter efficiency has less importance are aimed at. Smooth switching capacitors Cp and Cs can then be suppressed and times T2' and T4' can be made close to 0. In the embodiment of FIG. 12, this would translate as the suppression of delay lines 74 to 83. The converter will have higher switching losses, but will have the advantage of a simpler implementation while accepting significant variations of Vin and will have the possibility of setting Vout according to a wide range of values. As an alternative implementation, the parasitic capacitors of the MOS transistors can be used as smooth switching capacitors.

Those skilled in the art will also note that the control method and system which have just been described do not specifically apply to a converter of "fly-back" type like that of FIG. 10, but relate generally to any charge transfer bidirectional converter. Indeed, the present invention can also be applied to the "buck-boost" converter of FIG. 8, to the converter of FIG. 9A, or to the multiple-output converter of FIG. 9B. In the case of a "buck-boost" converter (FIG. 8), the above relations are applicable, at the condition, of course, to consider that Ns/Np=1. In the case of the multiple-output converter of FIG. 9B, an alternative implementation consists of adding secondary switches in secondary circuits 304 and 305 and controlling them together with switch Ts of secondary circuit 303, as if the secondary converter only included one switch.

Sensor 62 of FIG. 10 will now be described.
Bidirectional current sensor

Figure 16:
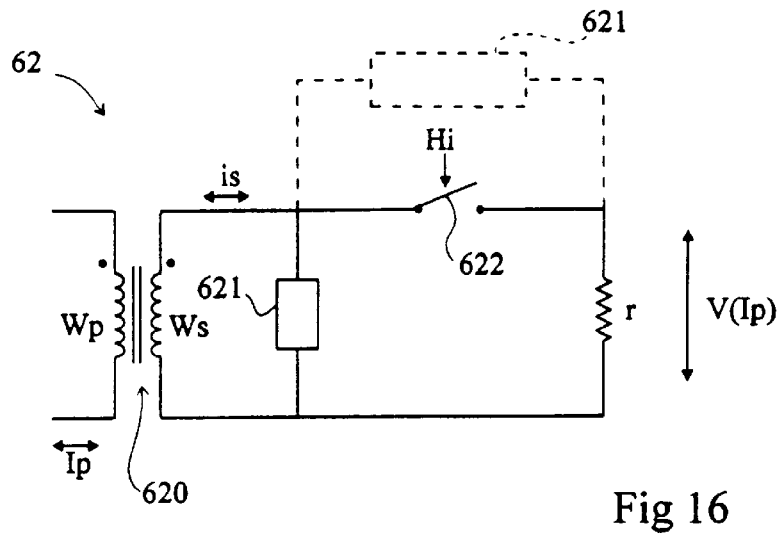
FIG. 16 shows the electric diagram of a current sensor according to the present invention.

FIG. 16 shows the current sensor 62 according to the present invention. Sensor 62 includes, conventionally, a transformer 620 including a primary winding Wp, through which flows the current Ip to be measured, a secondary winding Ws, a measuring resistor r, and a demagnetization impedance 621, for example a resistor with a high value or a zener diode. Conventionally, the sensor issues an output voltage V(Ip) equal to r*is, is being the secondary current in winding Ws. According to the present invention, a switch 622 controlled by a signal Hi is placed between resistor r and winding Ws. Thus, when the current Ip to be measured changes biasings in primary winding Wp, switch 622, if on, does not oppose the change of biasing of secondary current is, and the biasing of output voltage V(Ip) reverses. The sensor according to the present invention thus has the advantage of being bidirectional. Another advantage is that the risk of a fast magnetization of the magnetic core of transformer 620 is discarded, since, whatever the current direction in primary winding Wp, a current can flow through secondary winding Ws. This advantage requires of course that control Hi is generated so that switch 622 is always on when a current flows through primary winding Wp. As concerns the disposition of impedance 621 in the sensor, it should be noted that this impedance can be connected across winding Ws, or across switch 622 as shown in dotted lines in FIG. 16.

Despite the decrease of fast saturation risks, sensor 62 however requires a rest period for transformer 620 to demagnetize. During this rest period, switch 622 must be off and no current must flow through primary winding Wp. This characteristic of the sensor will be better understood with the following description of a method for controlling switch 622, in relation with FIG. 17.

Figure 17:
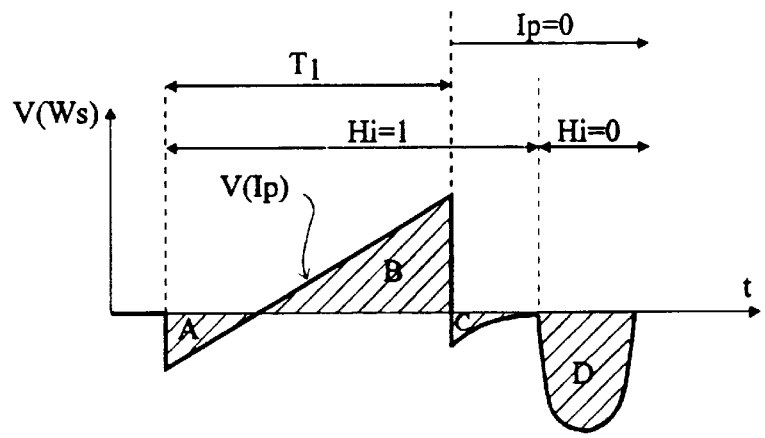
FIG. 17 shows the operation of the current sensor of FIG. 16.

FIG. 17 shows voltage V(Ws) across secondary winding Ws during an operating cycle of the converter of FIG. 10. During period T1, switch 622 is on (Hi=1), voltage V(Ws) is equal to output voltage V(Ip) of the sensor. V(Ip) mirrors current Ip and has the shape of a ramp, first negative (A) when Ip is negative, then positive (B) when Ip is positive. When Ip becomes zero (end of period T1), voltage V(Ip) switches to 0, but there remains in winding Ws a magnetization current which appeared in transformer 620 during the measuring phase. If switch 622 is maintained on, this magnetization current crosses resistor r, and creates across Ws a negative and decreasing demagnetization voltage with a low intensity (C). In FIG. 17, reference "A" represents the surface area (in Volts.seconds) of the negative part of the voltage ramp due to the negative current Ip, "B" represents the surface area of the voltage ramp due to the positive current Ip, and "C" represents the surface area of the demagnetization voltage. Due to the transformer properties, if switch 622 is left on, the demagnetization of the sensor will be reached when $$C=B-A,$$

that is, when the positive and negative surface areas of the voltages which appeared across the secondary winding will have canceled each other. The demagnetization current being low and decreasing, surface area "C" increases very slowly. If switch 622 is left in the on state, transformer 620 risks not to be entirely demagnetized at the beginning of the following cycle (T1). It is thus preferable to accelerate the demagnetization phenomenon by opening switch 622 (Hi= 0), so that the demagnetization current crosses the high value impedance 621. A greater voltage then appears across secondary winding Ws, with a shorter duration, and the surface area D of which is equal to $$D=B-(A+C)$$

In a system such as the converter described in relation with FIGS. 11 to 15, it is easy to generate a control signal Hi of switch 622, since there is a relation between the control of switches Tp and Ts and the flowing of current Ip. An example is given in FIG. 13. Above-described circuit 82 further includes a D flip-flop 826, the D input of which is at 1. The reset input CL of the D flip-flop receives the output /Q of flip-flop 825, the clock input CK receives the output of a comparator 827. Comparator 827 receives on its positive input the voltage ramp Vb issued by circuit 823, and on its negative input a fraction of voltage Va issued by circuit 821, applied via a voltage dividing bridge 828. The output /Q of flip-flop 826 issues control signal Hi of current sensor 62. FIG. 14A shows the shape of signals Hp and Hs provided to switches Tp and Ts of the comparator, as well as signal Hi for controlling sensor 62. It can be seen that Hi is at 0 for part of period T3. Again referring to FIG. 13, signal Hi appears to switch to 0 at the time when voltage ramp Vb becomes equal to the fraction of Va applied to comparator 827, and returns to 1 when signal S(T3) is transmitted (opening of Tp). Thus, when Hi is at 0 and switch 622 is off, current Ip is always zero and the sensor can demagnetize. The duration of the demagnetization phase can be set by means of voltage divider 828.

Figure 18:
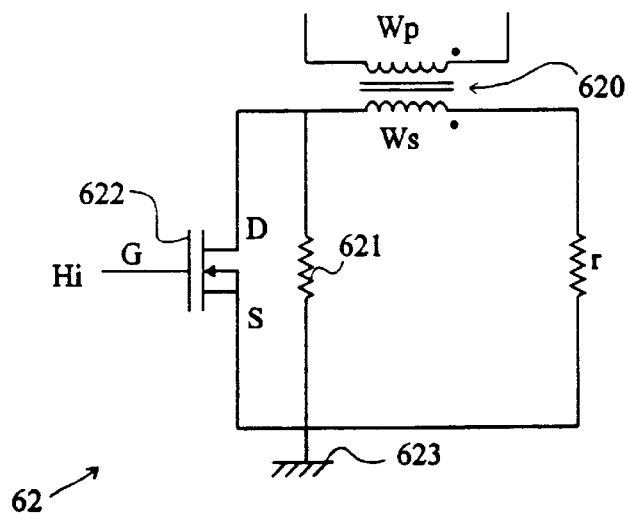
FIG. 18 shows a specific embodiment of the sensor of FIG. 16.

FIG. 18 shows a specific embodiment of sensor 62. Switch 622 is a MOS transistor of type 2N7002, having its gate G attached to signal Hi, its drain D connected to Ws, and its source S connected to measuring resistor r. Impedance 621 is a resistor of about ten kΩ, and measuring resistor r is about one hundred ohms. Primary winding Wp includes only one turn of coil and secondary winding Ws has 200 turns of coil. Impedance 621 is connected in parallel across switch 622, the potential reference 623 of the sensor being taken between resistor r and source S of MOS transistor 622.

Those skilled in the art will note that the current sensor according to the present invention is likely to have many applications other than that which has just been described. Generally, such a sensor can be used to punctually measure a current in any controlled circuit in which there is a link between the running of the current and the state of the circuit controls, based on which it will be possible to generate a signal for closing and opening the switch of the sensor.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A current sensor, including:
    a transformer having a primary winding and a secondary winding, the primary winding being arranged in a circuit likely to be run through by a current to be measured,
    a demagnetization impedance coupled to said transformer for demagnetizing the transformer, and
    a measuring resistor connected to the secondary winding for measuring a current flowing through the secondary winding, wherein said measuring resistor is connected to the secondary winding via a switch, and said switch is controlled to be on when said current is likely to run through the primary winding, and to be off for a time interval sufficient to ensure demagnetization of said transformer when no current is likely to run through the primary winding.

2. The current sensor according to claim 1, applied to measuring a current flowing by periods in a circuit, the periods when the current flows being controlled by means for controlling the circuit, a signal for controlling the switch of the sensor being generated by said means for controlling the circuit so that the switch is on at least during the current flow periods and off at least for a time interval outside said periods.

3. The current sensor according to claim 1, wherein said demagnetization impedance is coupled in parallel across said secondary winding.

4. The current sensor according to claim 1, wherein said demagnetization impedance is coupled in parallel across said switch.

5. A current sensor comprising:
a transformer including at least one primary and at least one secondary winding;
means coupled to said at least one secondary winding for demagnetizing said transformer;
a switch coupled to said at least one secondary winding and operable in a first mode to direct current from said at least one secondary winding to said means for demagnetizing said transformer for a time interval sufficient to substantially demagnetize said transformer, and a second mode; and,
at least one measuring resistor coupled to said switch for measuring a current flowing through said at least one secondarm winding in said second mode.

6. The current sensor of claim 5, wherein said switch is operable in said second mode to couple said at least one measuring resistor to said at least one secondary winding.

7. The current sensor according to claim 5, wherein said means for demagnetizing is coupled in parallel across said at least one secondary winding.

8. The current sensor according to claim 5, wherein said means for demagnetizing is coupled in parallel across said switch.

9. A current sensor comprising:
a transformer including at least one primary and at least on secondary winding;
an impedance coupled to said at least one secondary winding;
a switch coupled to said at least one secondary winding; and,
a measuring resistor coupled to said switch for measuring a current flowing through said secondary winding;
wherein, said switch is operable in a first mode to direct current from said secondary winding to said impedance for a time interval sufficient to substantially demagnetize said transformer, and a second mode to direct current from said secondary winding to said measuring resistor.

10. The current sensor of claim 9, wherein in said second mode, said switch couples said measuring resistor to said at least one second winding.

11. The current sensor according to claim 9, wherein said impedance is coupled in parallel across said at least one secondary winding.

12. The current sensor according to claim 9, wherein said impedance is coupled in parallel across said switch.

* * * * *